United States Patent
Choi et al.

(10) Patent No.: US 7,936,112 B2
(45) Date of Patent: May 3, 2011

(54) APPARATUS AND METHOD FOR CONVERTING ENERGY

(75) Inventors: Jaeyoung Choi, Yongin-si (KR); Jongmin Kim, Yongin-si (KR); Sang Yoon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 186 days.

(21) Appl. No.: 12/372,369

(22) Filed: Feb. 17, 2009

(65) Prior Publication Data

US 2010/0066208 A1    Mar. 18, 2010

(30) Foreign Application Priority Data

Sep. 17, 2008   (KR) ................. 10-2008-0091193

(51) Int. Cl.
    *H01L 41/107*   (2006.01)
(52) U.S. Cl. ............................................. 310/339
(58) Field of Classification Search ............ 310/339
    See application file for complete search history.

(56) References Cited

U.S. PATENT DOCUMENTS

| | | | |
|---|---|---|---|
| 7,116,213 B2 * | 10/2006 | Thiesen et al. | 340/10.1 |
| 2008/0067618 A1 | 3/2008 | Wang et al. | |
| 2008/0100182 A1 * | 5/2008 | Chang et al. | 310/339 |
| 2008/0251865 A1 * | 10/2008 | Pinkerton | 257/414 |
| 2009/0115293 A1 * | 5/2009 | Wang et al. | 310/364 |
| 2009/0179523 A1 * | 7/2009 | Wang et al. | 310/338 |
| 2009/0295257 A1 * | 12/2009 | Wang et al. | 310/367 |
| 2009/0309456 A1 * | 12/2009 | Stollberg | 310/319 |
| 2009/0309458 A1 * | 12/2009 | Chou | 310/339 |

FOREIGN PATENT DOCUMENTS

| | | |
|---|---|---|
| KR | 1020070084553 A | 8/2007 |
| WO | WO2004/032191 A2 | 4/2004 |
| WO | WO2007/027664 A2 | 3/2007 |
| WO | WO-2007/076254 A2 * | 7/2007 |

OTHER PUBLICATIONS

K. Jensen, et al.; Nanotube Radio; Nano Letters 2007 vol. 7, No. 11, pp. 3508-3511; Published Oct. 31, 2007; Berkeley, California.
Zhaoyu Wang, et al.; Voltage Generation from Individual BaTiO3 Nanowires under Periodic Tensile Mechanical Load; Nano Letters 2007 vol. 7, No. 10, pp. 2966-2969; Published Sep. 26, 2007; Urbana, Illinois.
Yong Qin, et al.; Microfibre-nanowire hybrid structure for energy scavenging; Nature Letters vol. 451; Feb. 14, 2008; Atlanta Georgia.
Yong Lei, et al.; Ordered Arrays of Nanostructures and Applications in High-Efficient Nano-Generators; Advanced Engineering Materials 2007, vol. 9, No. 5, pp. 343-348.
Michael R. McDevitt, et al.; Tumor Therapy with Trageted Atomic Nanogenerators; Science, vol. 294, pp. 1537-1540, Nov. 16, 2001; Downloaded from www.sciencemag.org on Sep. 16, 2008.
Zhong Lin Wang, et al.; Piezoelectric Nanogenerators Based on Zinc Oxide Nanowire Arrays; Science, vol. 312, pp. 242-246, Apr. 16, 2006; Downloaded from www.sciencemag.org on Sep. 16, 2008.
Xudong Wang, et al.; Direct-Current Nanogenerator Driven by Ultrasonic Waves; Science, vol. 316, pp. 102-105, Apr. 16, 2007; Downloaded from www.sciencemag.org on Sep. 16, 2008.

* cited by examiner

*Primary Examiner* — Thomas M Dougherty
(74) *Attorney, Agent, or Firm* — Cantor Colburn LLP (57) ABSTRACT

Exemplary embodiments relate to an energy converting apparatus and a method for converting energy, which may convert energy of an applied signal into electrical energy. The energy converting apparatus may include at least one nanowire which resonates in response to the applied signal. The resonating nanowire may contact an electrode allowing a current to flow through the electrode and the nanowire by a Schottky contact between the electrode and the nanowire. The method for converting energy may include applying a signal to at least one nanowire to resonate the nanowire, and generating electrical energy through the contact between the resonating nanowire and an electrode.

18 Claims, 13 Drawing Sheets

APPARATUS AND METHOD FOR CONVERTING ENERGY

CROSS-REFERENCE TO RELATED APPLICATION

This application claims priority to Korean Patent Application No. 10-2008-0091193, filed on Sep. 17, 2008, and all the benefits accruing therefrom under 35 U.S.C. §119, the contents of which in its entirety are herein incorporated by reference.

BACKGROUND

1. Field

Exemplary embodiments relate to an apparatus and method for converting energy which may convert energy transferred by a signal such as an electromagnetic wave into electric energy.

2. Description of the Related Art

Recently, with the reduction of size and the improvement of performance of devices, nano-scale devices have emerged. To manufacture the nano-scale devices, a technique for forming a nanowire having a diameter of several nanometers has been developed. Further, the nanowire may be grown so as to have a length several thousand times larger than the diameter thereof.

The nanowire may exhibit electrical, chemical, physical, and optical characteristics, different from those of the bulk structure. Using such characteristics, more minute and integrated devices may be realized. The nanowire may be used in various devices such as lasers, transistors, memories, and sensors.

SUMMARY

Exemplary embodiments provide an energy converting apparatus and a method for converting energy which may convert energy transferred by a signal such as an electromagnetic wave into electric energy through a Schottky contact between a nanowire and a metal.

An energy converting apparatus may include first and second electrodes spaced apart from each other; and a nanowire formed on the first electrode, which is composed of a piezoelectric material and resonates in response to an applied signal so as to contact the second electrode.

The second electrode may have irregularities, and the nanowire may be positioned adjacent to concave portions of the irregularities.

The energy converting apparatus may further include a storage unit connected between the first and second electrodes and stores electric energy. The storage unit may include a chargeable battery or capacitor.

The nanowire may include a plurality of nanowires having different resonance frequencies from one another. Further, the plurality of nanowires may have different lengths or diameters from one another, and may be formed of different materials from one another.

A method for converting energy may include applying a signal to a nanowire formed of a piezoelectric material to resonate the nanowire; and generating electric energy through a contact between the resonating nanowire and an electrode.

BRIEF DESCRIPTION OF THE DRAWINGS

The above and other features of exemplary embodiments may be better appreciated in view of the following detailed description in conjunction with the accompanying drawings, in which.

DETAILED DESCRIPTION

Figure 1:
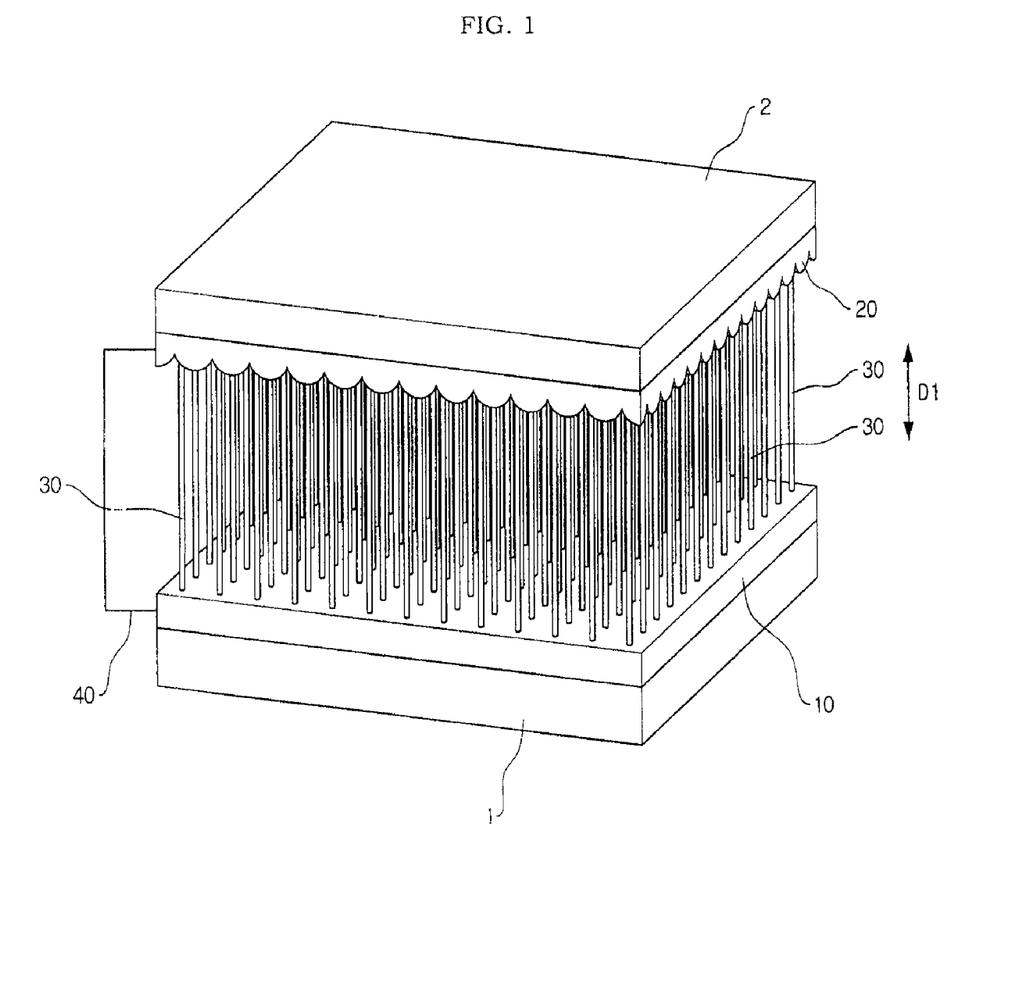
FIG. 1 is a perspective view of an energy converting apparatus according to an exemplary embodiment.
Figure 2:
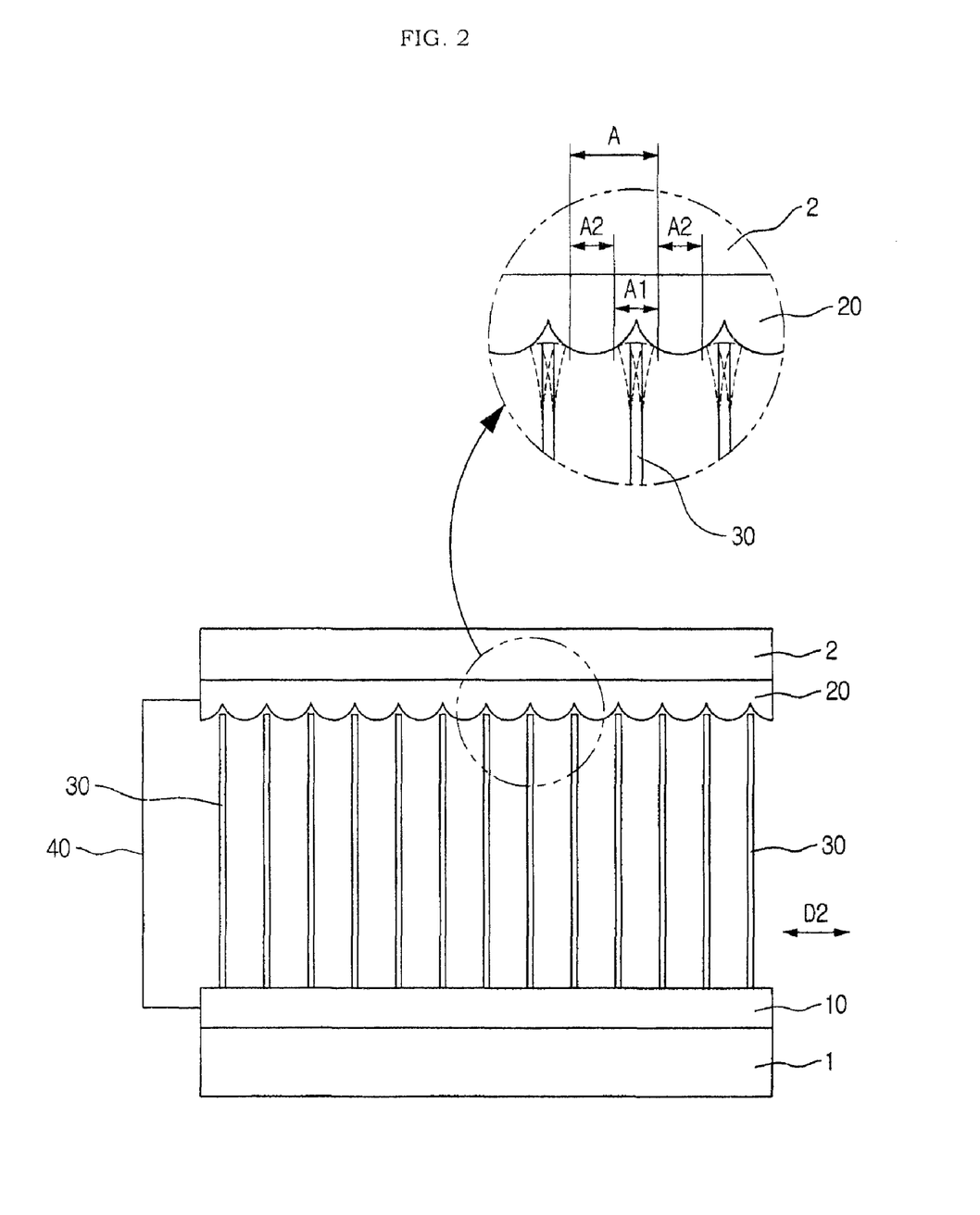
FIG. 2 is a front view of the energy converting apparatus shown in FIG. 1.

FIG. 1 is a perspective view of an energy converting apparatus according to an exemplary embodiment. FIG. 2 is a front view of the energy converting apparatus shown in FIG. 1.

Referring to FIGS. 1 and 2, the energy converting apparatus may include first and second electrodes 10 and 20 spaced apart from each other and at least one nanowire 30 formed on the first electrode 10.

The first electrode 10 may be a lower electrode which supports the nanowire 30. Further, the first electrode 10 may include a conductor.

The first electrode 10 may be formed on a substrate 1. The substrate 1 may be formed of glass, silicon (Si), polymer, sapphire, gallium nitride ("GaN"), silicon carbonate ("SiC") or other suitable material. For example, the first electrode 10 may include a metallic film or conductive ceramic formed on the substrate 1.

The second electrode 20 may be positioned so as to be spaced apart from the first electrode 10. The second electrode 20 may be electrically connected to the first electrode 10 through a conductor 40. Further, the second electrode 20 may include a conductor. Further, the second electrode 20 may be formed on a substrate 2.

In an exemplary embodiment, the first electrode 10 and the second electrode 20 may be formed of at least one of ITO, carbon nanotubes ("CNT"), a conductive polymer, a nanofiber, a nanocomposite, gold-palladium alloy ("AuPd"), gold (Au), palladium (Pd), platinum (Pt) and ruthenium (Ru).

At least one nanowire 30 may be formed on the first electrode 10. The nanowire 30 may be positioned so as to be spaced apart from the second electrode 20. Further, the nanowire 30 may extend in a direction D1 perpendicular to the first and second electrodes 10 and 20. Alternatively, the nanowire 30 may extend in an inclined direction with respect to the first and second electrodes 10 and 20. The number of the nanowires 30 shown in the drawings is non-limiting. The number of the nanowires 30 may differ depending on the size of the apparatus, intended use of the apparatus, or other related variables.

There may be several advantages in forming the nanowire 30 on the first electrode 10. For example, a conductivity of the nanowire 30 may be improved since the nanowire 30 is formed on the first electrode 10 which is a conductor. Further, it may become easier to control the growth of the nanowire 30. For example, the nanowire 30 may be grown vertically on the first electrode 10. Furthermore, a uniformity of the shapes or longitudinal directions of the nanowires 30 may be improved.

In an exemplary embodiment, the first electrode 10 and the nanowire 30 may be formed of different materials.

Referring to FIG. 2, the second electrode 20 may include irregularities A. For example, the irregularities A of the second electrode 20 may have a ripple-shaped structure composed of one or more concave portions A1 and one or more convex portions A2. The irregularities A may have a curved surface or inclined surface. For example, the second electrode 20 may include the irregularities A having a semi-circular cross-sectional shape, as shown in FIG. 2.

When the second electrode 20 includes the irregularities A, the nanowire 30 may be positioned adjacent to the concave portions A1 of the irregularities A of the second electrode 20.

A signal having a frequency corresponding to a resonance frequency of the nanowire 30 may be applied to the nanowire 30. The signal may be applied wirelessly. For example, the signal may be an electromagnetic wave or a radio frequency ("RF") wave. The RF wave may have a frequency of about 3 kHz to about 300 MHz.

The nanowire 30 may have relatively high tensile strength and elasticity. When a signal having a frequency corresponding to the resonance frequency of the nanowire 30 is applied to the nanowire 30, the nanowire 30 may resonate in response to the energy transferred by the signal.

For example, an electromagnetic wave having a frequency corresponding to the resonance frequency of the nanowire 30 may be applied to the nanowire 30. Electrons in the nanowire 30 may be moved by an electromagnetic field generated by the electromagnetic wave. As a result, the nanowire 30 may resonate in response to the electromagnetic wave. For example, the nanowire 30 may vibrate in both directions D2 in response to the applied signal. When the nanowire 30 vibrates, the nanowire 30 may be bent so as to contact the second electrode 20.

The nanowire 30 may be formed of a piezoelectric material. When the nanowire 30 is bent, the nanowire 30 may exhibit a piezoelectric effect. For example, each portion of the nanowire 30 may have a predetermined potential depending on compressive stress or tensile stress applied to the nanowire 30.

The nanowire 30 may include ZnO as the piezoelectric material. When the nanowire 30 formed of ZnO resonates so as to be bent, each portion of the nanowire 30 may have a potential, because ZnO has an asymmetric crystal structure. Therefore, a current may flow between the bent nanowire 30 and the second electrode 20. This will be described in detail with reference to FIG. 3.

The nanowire 30 may be formed of a piezoelectric material which exhibits a piezoelectric effect when stress is applied, other than ZnO. For example, the nanowire 30 may be formed of lead zirconate titanate ("PZT") or barium titanate ("BaTiO$_3$").

Figure 3:
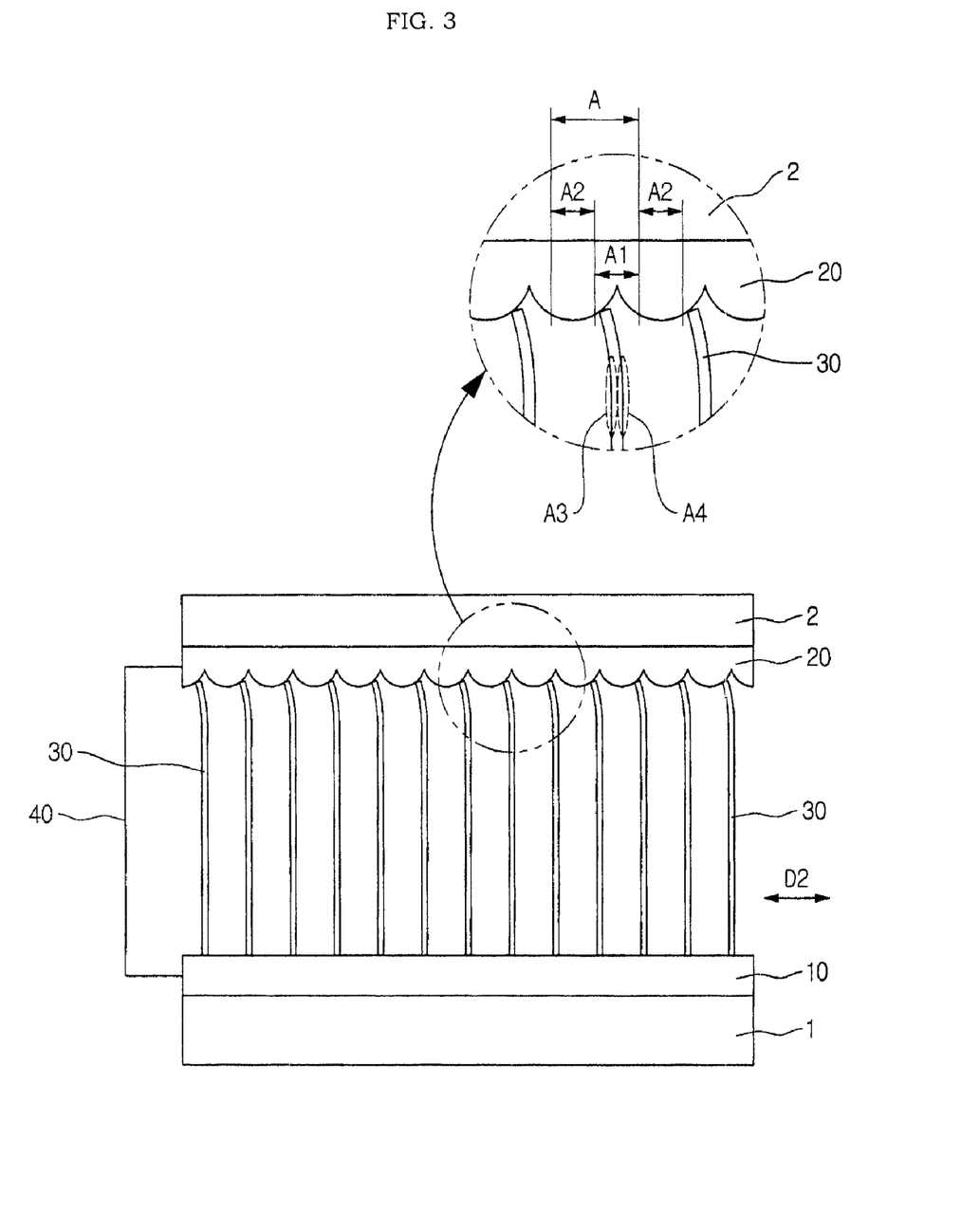
FIG. 3 is a front view of the energy converting apparatus of FIG. 1, showing a state in which a signal is applied to the energy converting apparatus to resonate the nanowire.

FIG. 3 is a front view of the energy converting apparatus of FIG. 1, showing a state in which a signal is applied to the energy converting apparatus such that the nanowire 30 resonates.

Referring to FIG. 3, when a signal is applied to the nanowire 30, the nanowire 30 may resonate so as to vibrate in both directions D2. The bent nanowire 30 may come in contact with the second electrode 20. As described above, the nanowire 30 may be formed of a piezoelectric material. When the nanowire 30 is bent, the nanowire may exhibit a piezoelectric effect.

For example, when the nanowire 30 is formed of ZnO, compressive stress may be applied to a portion A3 of the nanowire 30. Then, the portion A3 may have a negative potential. Meanwhile, tensile stress may be applied to another portion A4 of the nanowire 30. The portion A4 may have a positive potential.

The nanowire 30 may be positioned adjacent to the concave portions A1 of the irregularities A of the second electrode 20. When the nanowire 30 resonates so as to be bent, the bent nanowire 30 may at least partially come in contact with the second electrode 20.

As described above, the portion A3 of the nanowire 30 to which compressive stress has been applied may have a negative potential. Alternately, the second electrode 20 may not have an electric potential. Therefore, the portion A3 to which compressive stress has been applied and the second electrode 20 may form a forward-biased Schottky diode. Therefore, a current may flow from the second electrode 20 toward the nanowire 30. The current may flow through a closed loop formed by the second electrode 20, the nanowire 30, the first electrode 10, and the conductor 40.

The portion A4 of the nanowire 30 to which tensile stress has been applied may have a positive potential. Therefore, the portion A4 to which tensile stress has been applied and the second electrode 20 may form a reverse-biased Schottky diode. Therefore, a current may not flow between the portion A4 and the second electrode 20.

As described above, the nanowire 30 may be resonated by applying a signal having a frequency corresponding to the resonance frequency of the nanowire 30. Therefore, a current may flow through the Schottky contact between the second electrode 20 and the portion A3 of the resonating nanowire 30 to which compressive stress has been applied. Therefore, the signal applied to the nanowire 30 may be converted into electric energy.

The energy converting apparatus may be applied to various electronic apparatuses. For example, since the energy converting apparatus may convert a wirelessly-applied signal into electric energy, it may be used for implementing a wireless energy transmission technique.

For example, the energy converting apparatus may be used in a mobile communication device such as a mobile phone. Electrical power may be supplied from a long distance to the mobile phone without a conducting wire. Further, the energy converting apparatus may be used in a stationary appliance such as TV or audio equipment such that electrical power may be supplied from a long distance.

A signal for the resonance of the nanowire may be applied to the energy converting apparatus by a signal generating device. For example, an RF wave generator or other suitable devices may be used as the signal generating device. Further, when the resonance frequency of the nanowire is made to coincide with the frequency band used in a mobile communication device, electric energy may be generated from a communication signal without a separate signal source.

Figure 4A:
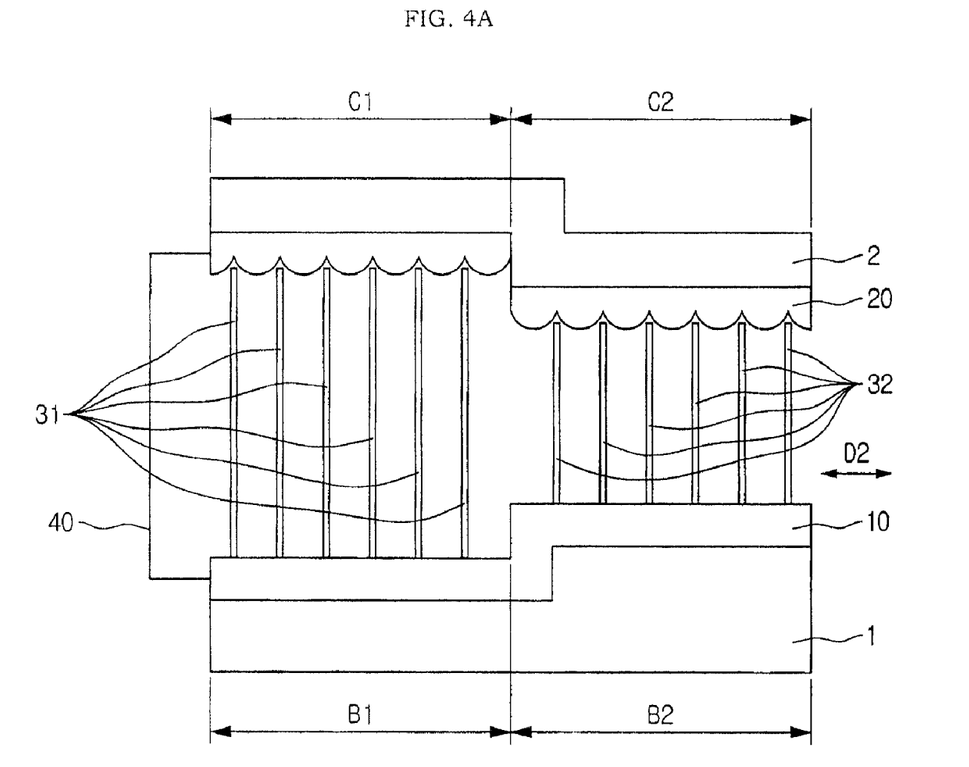
FIG. 4A is a front view of an energy converting apparatus according to another exemplary embodiment.

FIG. 4A is a front view of an energy converting apparatus according to another exemplary embodiment.

The energy converting apparatus shown in FIG. 4A may include a plurality of nanowires 31 and 32 having a different resonance frequency from one another. For example, the plurality of nanowires may include at least one first nanowire 31 having a first resonance frequency and at least one second nanowire 32 having a second resonance frequency.

The length of first nanowire 31 may be different from that of the second nanowire 32 such that the first nanowire 31 has a different resonance frequency from the second nanowire 32. The resonance frequencies of the nanowires 31 and 32 may be determined at least partially on the basis of the lengths and diameters of the nanowires 31 and 32, the kinds of materials forming the nanowires 31 and 32, or other related variables.

The first nanowire 31 may have a relatively larger length that the second nanowire 32. Therefore, the resonance frequency of the first nanowire 31 may be different from that of the second nanowire 32.

The first and second electrodes 10 and 20 may have a step structure such that a current may flow through the first and second nanowires 31 and 32. For example, the first electrode 10 may include first and second regions B1 and B2. The second region B2 may be formed to protrude more upwardly than the first region B1. Further, the second electrode 20 may include first and second regions C1 and C2. The second region C2 may be formed to protrude downwardly with respect to the first region C1.

When the plurality of nanowires in the energy converting apparatus have different resonance frequencies from one another, electric energy may be generated from a plurality of signals having a different frequency from one another. For example, when a signal having the first resonance frequency is applied, the first nanowire 31 may resonate such that a current may flow therethrough. Further, when a signal having the second resonance frequency is applied, the second nanowire 32 may resonate such that a current may flow therethrough.

Figure 4B:
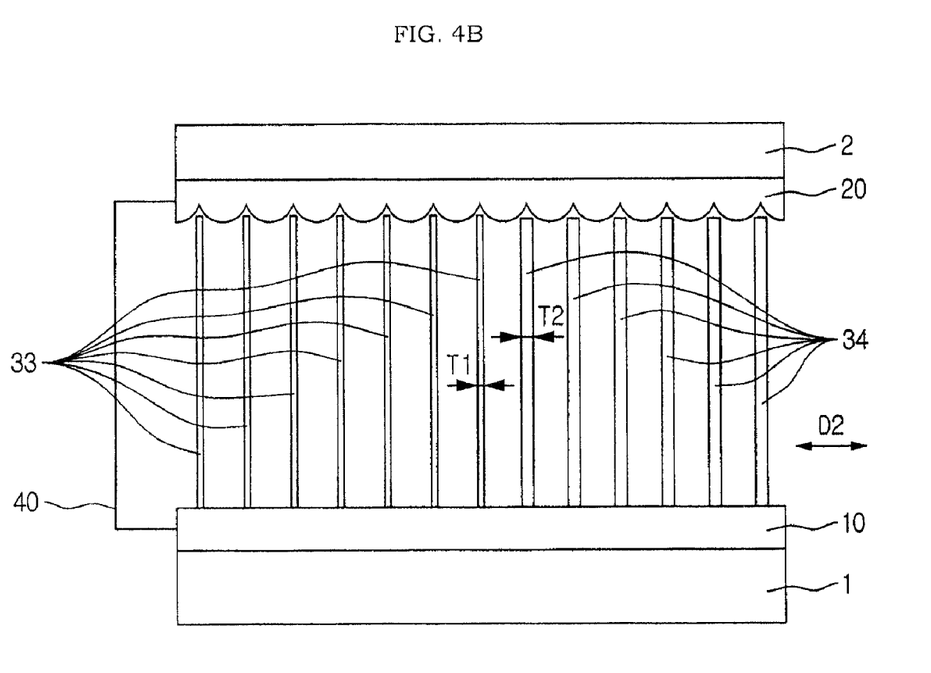
FIG. 4B is a front view of an energy converting apparatus according to still another exemplary embodiment.

FIG. 4B is a front view of an energy converting apparatus according to still another exemplary embodiment.

In FIG. 4B, the constructions and functions of the first and second electrodes 10 and 20 are the same as the corresponding features previously described with respect to FIGS. 1-3. Therefore, the detailed description of the previously-discussed features will be omitted for the purpose of brevity.

The energy converting apparatus may include third and fourth nanowires 33 and 34 having a different diameter from each other. For example, the diameter T1 of the third nanowire 33 may be smaller than the diameter T2 of the fourth nanowire 34.

As described above, the resonance frequencies of the nanowires 33 and 34 may be determined on the basis of the lengths, diameters, and materials of the nanowires 33 and 34. Therefore, the third and fourth nanowires 33 and 34 having a different diameter may have a different resonance frequency from each other.

Since operation of the energy converting apparatus shown in FIG. 4B may be easily understood from the energy converting apparatus shown in FIG. 4A, the detailed descriptions thereof will be omitted for the purpose of brevity.

The energy converting apparatus shown in FIG. 4A is constructed in such a manner that the plurality of nanowires have a different length from one another, and the energy converting apparatus shown in FIG. 4B is constructed in such a manner that the plurality of nanowires have a different diameter from one another. Therefore, the nanowires may have a different resonance frequency from one another. Alternatively, when the plurality of nanowires are formed of different materials, the resonance frequencies of the nanowires may be different from one another.

Figure 5:
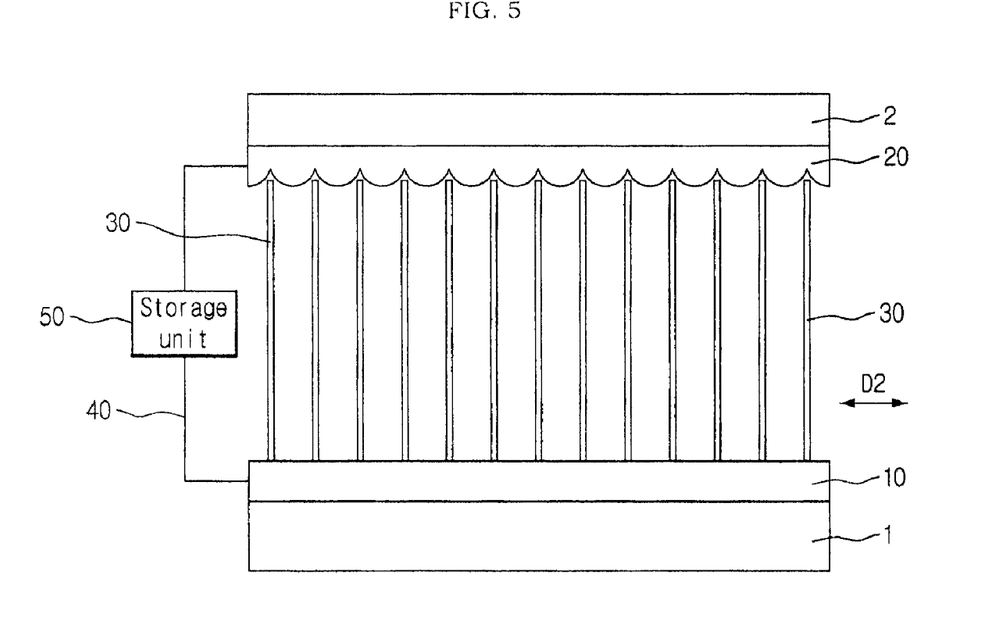
FIG. 5 is a front view of an energy converting apparatus according to still another exemplary embodiment.

FIG. 5 is a front view of an energy converting apparatus according to still another exemplary embodiment.

In the energy converting apparatus shown in FIG. 5, the construction and operation of the first and second electrodes 10 and 20 and the nanowires 30 are the same as the corresponding features previously described with respect to FIGS. 1-3. Therefore, the detailed description of the previously-discussed features will be omitted for the purpose of brevity.

The energy converting apparatus shown in FIG. 5 may further include a storage unit 50 connected between the first and second electrodes 10 and 20. The storage unit 50 may serve to store electrical energy generated by the resonance of the nanowire 30. The storage unit 50 may be connected in the middle of a conductor 40 as shown in FIG. 5. Alternatively, the storage unit 50 may be connected in parallel to the conductor 40.

The storage unit 50 may include a chargeable battery or capacitor. For example, the storage unit 50 may include a secondary battery such as a nickel-cadmium battery, nickel-hydrogen battery, lithium-ion battery, or lithium polymer battery or a capacitor.

When the energy converting apparatus including the storage unit 50 is used in an electronic apparatus, electrical energy generated by the resonance of the nanowire 30 may not be used immediately but stored in the storage unit 50. The energy stored in the storage unit 50 may be used when an electronic apparatus is operated later.

FIGS. 6A-6D are diagrams showing a method of manufacturing the energy converting apparatus.

Figure 6A:
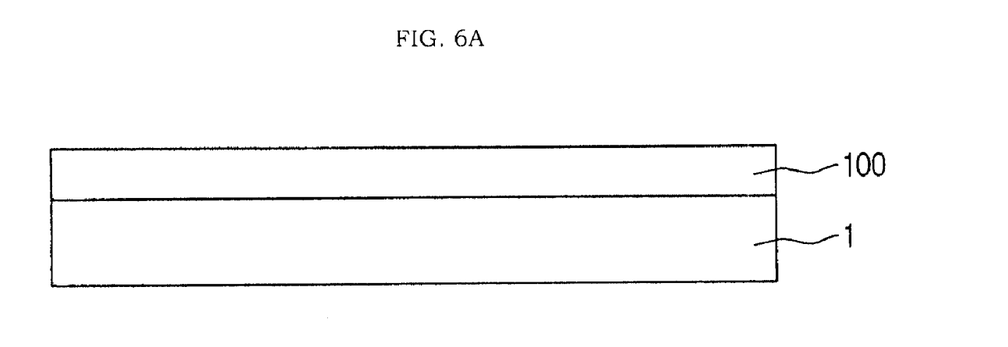
FIGS. 6A-6D are diagrams showing a method of manufacturing the energy converting apparatus.

Referring to FIG. 6A, a first electrode layer 100 may be formed on a substrate 1. The substrate 1 may be formed of glass, silicon, polymer or other suitable material. The first electrode layer 100 may be formed of a conductive material. For example, the first electrode layer 100 may be formed of at least one of ITO, CNT, a conductive polymer, nanofibers and a nanocomposite. The first electrode layer 100 may also be formed of at least one of AuPd alloy, Au, Pd, Pt and Ru. The first electrode layer 100 may serve as a lower electrode for supporting a nanowire which is to be formed at subsequent processes.

Figure 6B:
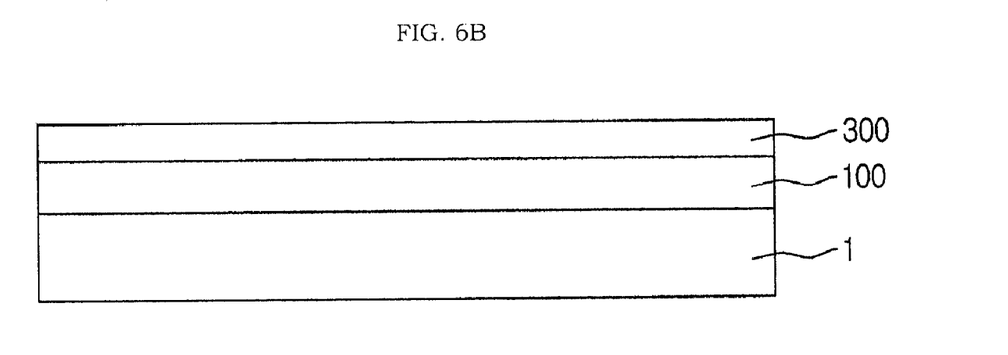

Referring to FIG. 6B, a nano-material layer 300 may be formed on the first electrode layer 100. The nano-material layer 300 may be formed thinly on the first electrode layer 100 by a spring coating method or other suitable method. The first electrode layer 100 and the nano-material layer 300 may be formed of different materials. For example, the nano-material layer 300 may be formed of zinc acetate.

Figure 6C:
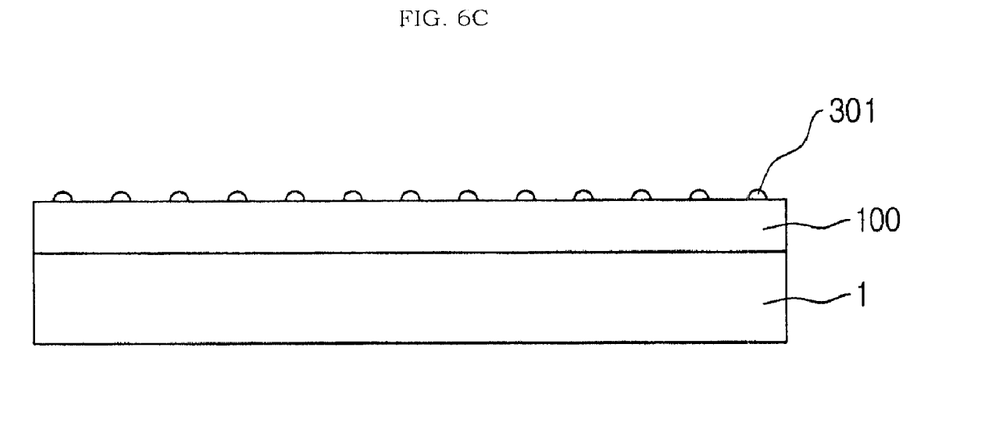

Referring to FIGS. 6B and 6C, at least one nano-nuclei 301 may be formed by heating the substrate 1 having the nano-material layer 300 formed thereon. For example, the substrate 1 having the nano-material layer 300 formed thereon may be heated at a temperature of about 100° C. and then dried so as to form the nano-nuclei 301 from the nano-material layer 300.

Figure 6D:
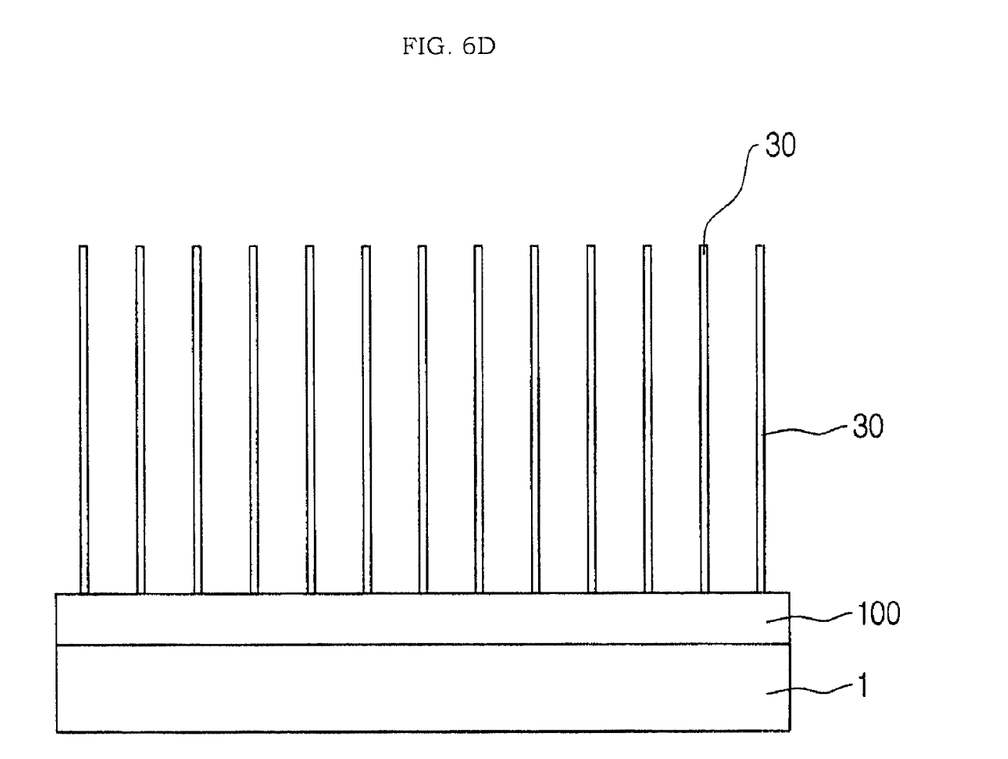

Referring to FIGS. 6C and 6D, the substrate 1 having the nano-nuclei 301 formed thereon may be put into a solution in which nano-materials are dissolved. At least one nanowire 30 may be grown from the respective nano-nuclei 301.

In the process described with respect to FIGS. 6A-6D, the first electrode and the nanowire of the energy converting apparatus may be formed.

FIGS. 7A-7G are diagrams showing a process of manufacturing the second electrode in the energy converting apparatus.

Figure 7A:
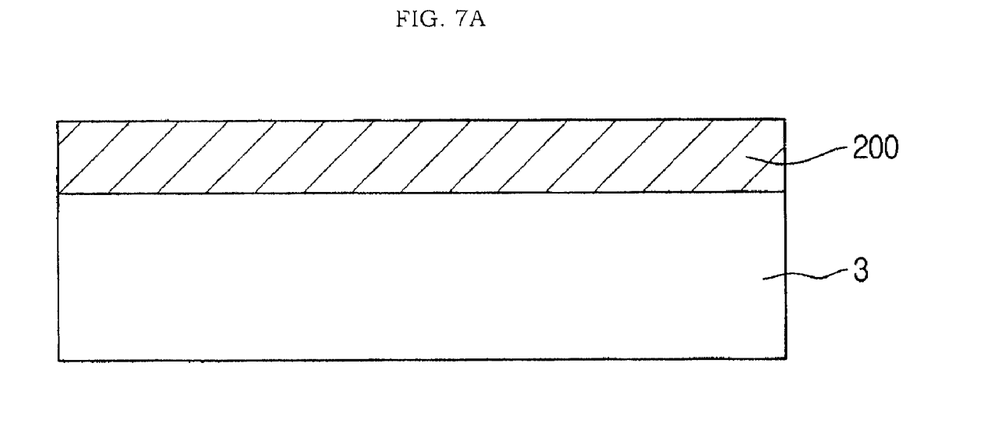
FIGS. 7A-7G are diagrams showing a process of manufacturing a second electrode in the energy converting apparatus.

Referring to FIG. 7A, a metal layer 200 may be formed on a template substrate 3. The template substrate 3 may be a silicon wafer or other suitable substrate. The metal layer 200 may be formed of aluminum (Al) or other suitable material.

Figure 7B:
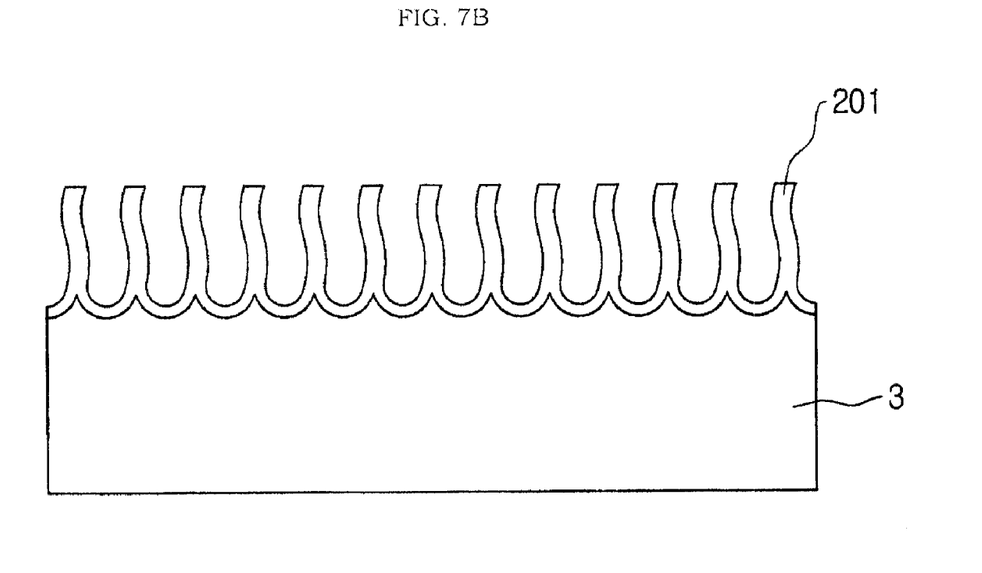

Referring to FIG. 7B, an anodized film 201 may be formed by anodizing the metal layer 200. The anodizing may refer to a process of electrolyzing the metal layer 200 in an electrolyte solution using the metal layer 200 as an anode. While the anodizing is performed, the material of the metal layer 200 may be dissolved in the electrolyte, and simultaneously, the thickness of the natural oxide film formed on the metal layer 200 may increase. As a result, the anodized film 201 with a structure shown in FIG. 7B may be formed.

Figure 7C:
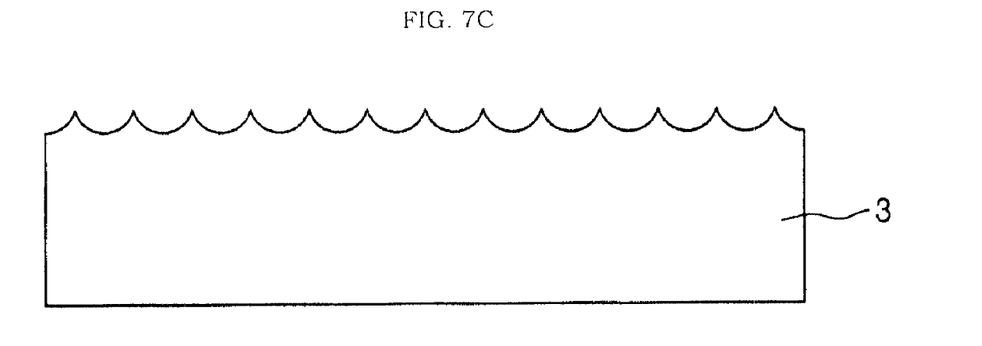

Referring to FIG. 7C, the anodized film 201 formed by the anodizing process may be removed. For example, the anodized film 201 may be removed by wet etching, drying etching or other suitable method. After the anodized film 201 is removed, the template substrate 3 may include irregularities with a ripple-shaped structure.

Figure 7D:
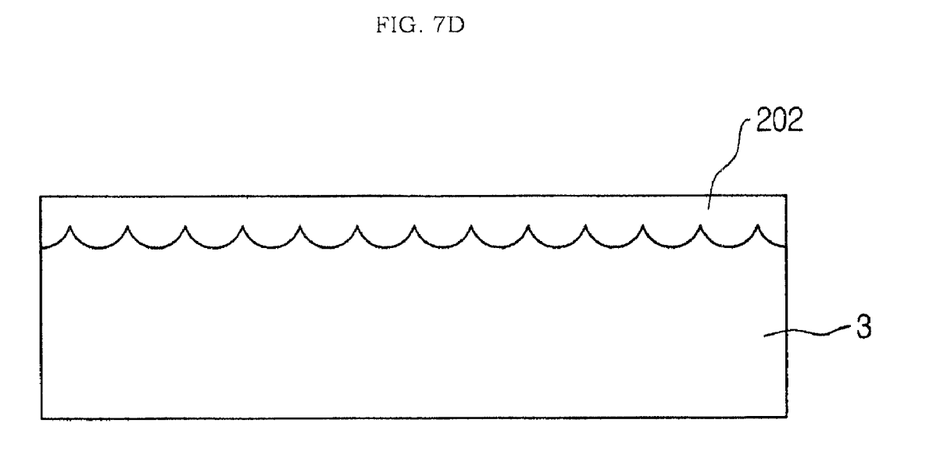

Referring to FIG. 7D, a second electrode layer 202 may be formed on the template substrate 3. The second electrode layer 202 may serve as an upper electrode which comes in contact with the nanowire so as to allow the flow of an electric current. The second electrode layer 202 may be formed of at least one selected from the group consisting of Au—Pd alloy, Au, Pt, Pd, Ru, and any mixtures thereof, or other suitable material. The second electrode layer 202 may also be formed of at least one selected from the group consisting of ITO, CNT, a conductive polymer, nanofibers and a nanocomposite. The second electrode 202 may be formed by an ion sputtering method or other suitable method.

Figure 7E:
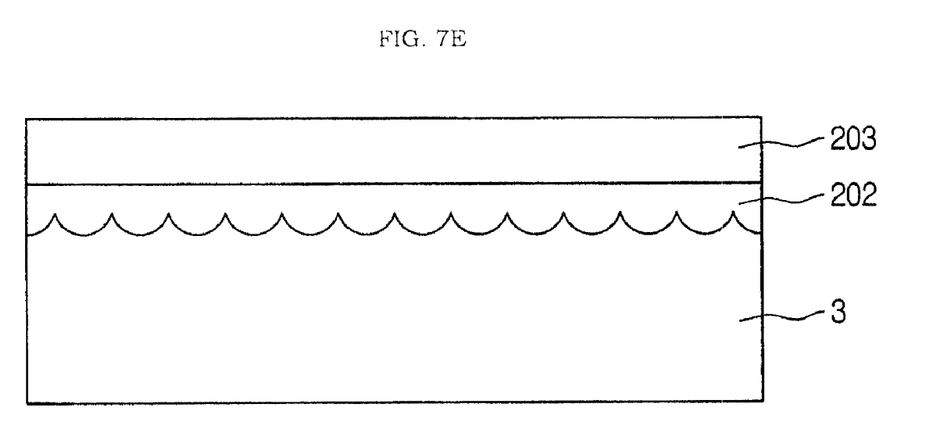

Referring to FIG. 7E, an adhesive layer 203 may be formed on the second electrode layer 202. The adhesive layer 203 may serve to increase an adhesion between the second electrode layer 202 and a transport substrate which is to be formed at subsequent processes. The adhesive layer 203 may be formed of nickel (Ni) or other suitable material. The adhesive layer 203 may be formed by electroplating or other suitable method.

Figure 7F:
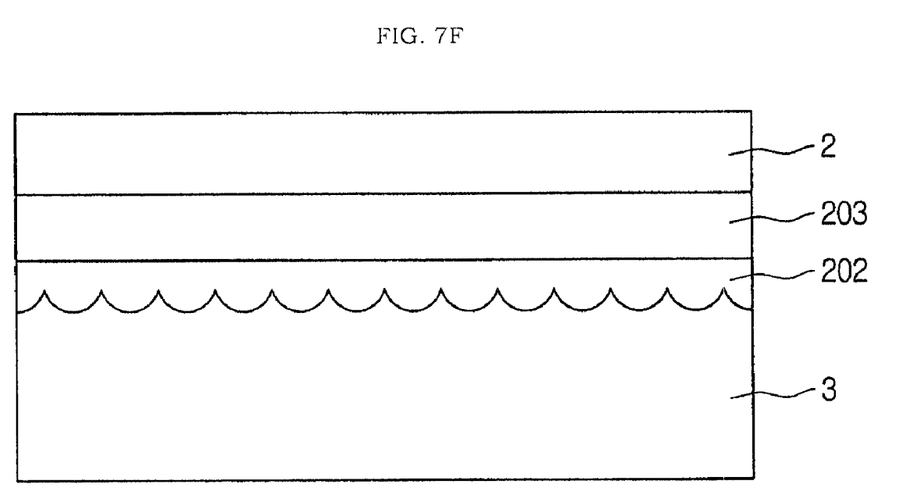

Referring to FIG. 7F, the transport substrate 2 may be bonded on the adhesive layer 203. Alternatively, the transport substrate 2 may be bonded on the second electrode layer 202 without the adhesive layer 203. Further, the transport substrate 2 may be formed of a polymer.

Figure 7G:
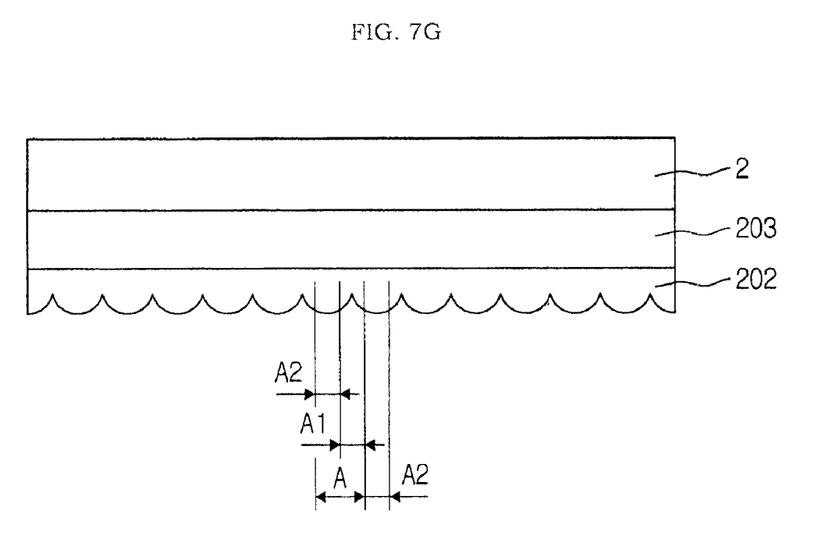

Referring to FIG. 7G, the second electrode layer 202, the adhesive layer 203, and the transport substrate 2 may be separated from the template substrate 3. The separated second electrode layer 202 may include irregularities A having concave portions A1 and convex portions A2, which may be formed as the shape of the template substrate 3.

In the process described with respect to FIGS. 7A-7G, the second electrode which is to be bonded to the first electrode and the nanowire may be formed.

Figure 8A:
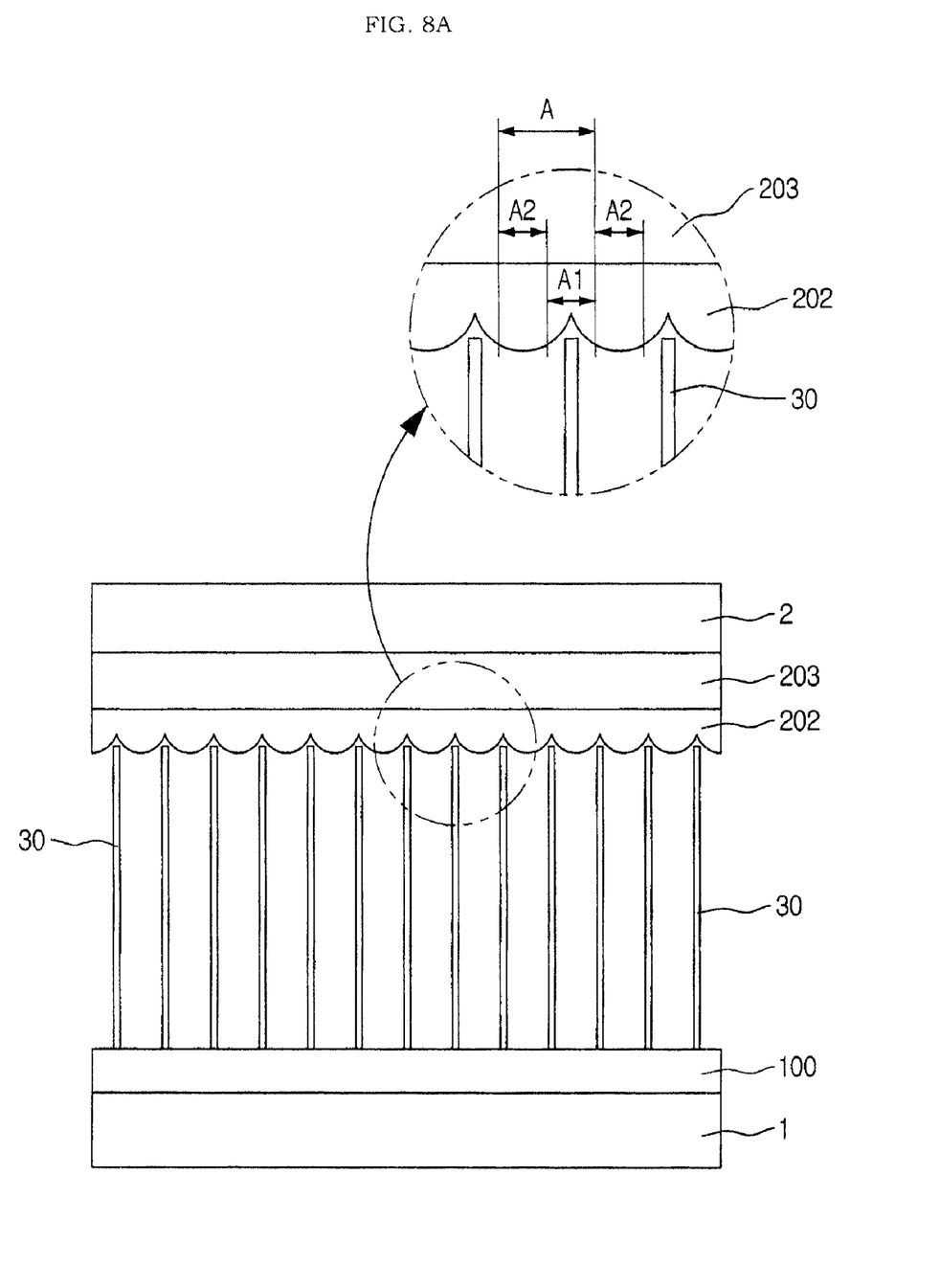
FIGS. 8A and 8B are diagrams showing a process of completing the manufacturing of the energy converting apparatus.
Figure 8B:
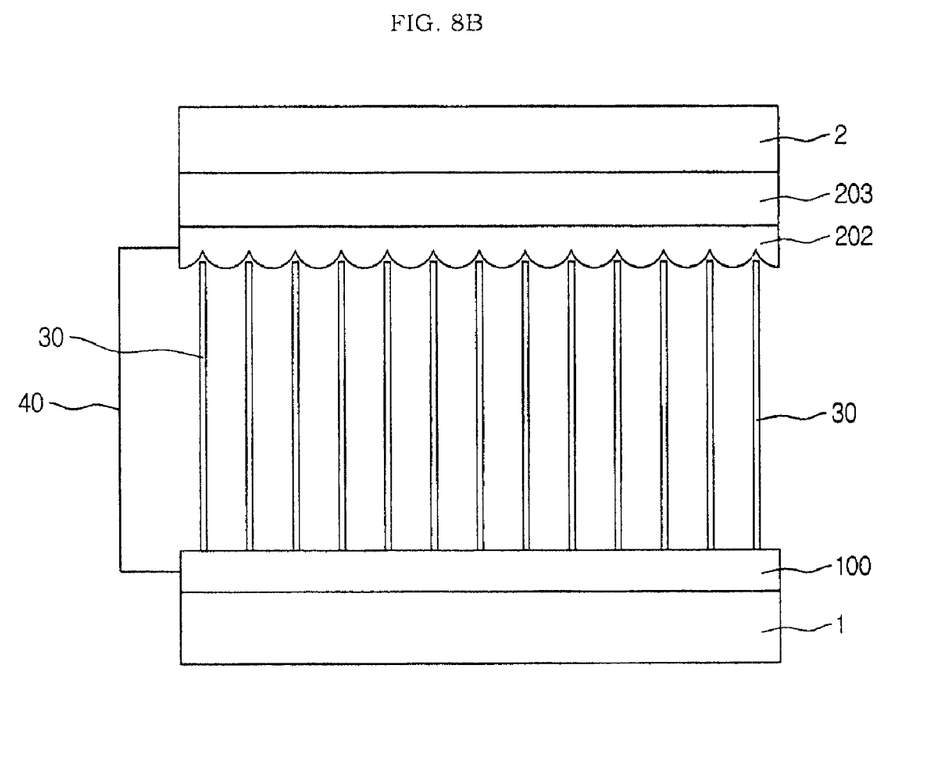

FIGS. 8A and 8B are diagrams showing a process of completing the manufacturing of the energy converting apparatus by positioning the nanowire and the second electrode close to each other.

Referring to FIG. 8A, the nanowire 30 may be positioned adjacent to the second electrode layer 202. The nanowire 30 may be contacted with the second electrode layer 202. Alternatively, the nanowire 30 may be spaced by a predetermined distance from the second electrode layer 202. The nanowire 30 may be positioned adjacent to the concave portions A1 of the irregularities A of the second electrode layer 202.

Referring to FIG. 8B, the first electrode layer 100 and the second electrode layer 200 may be connected to each other through a conductor 40, thereby completing the manufacturing of the energy converting apparatus.

While exemplary embodiments have been disclosed herein, it should be understood that other variations may be possible. Such variations are not to be regarded as a departure from the spirit and scope of exemplary embodiments of the present application, and all such modifications as would be obvious to one skilled in the art are intended to be included within the scope of the following claims.

What is claimed is:

1. An energy converting apparatus comprising:
   first and second electrodes spaced apart from each other; and
   a first nanowire formed on the first electrode, which is composed of a piezoelectric material, the first nanowire being configured to resonate in response to an electromagnetic wave at a first frequency so as to contact the second electrode.

2. The energy converting apparatus according to claim 1, wherein the second electrode has irregularities, and
   wherein the first nanowire is positioned adjacent to concave portions of the irregularities.

3. The energy converting apparatus according to claim 2, wherein the irregularities have a curved or inclined surface.

4. The energy converting apparatus according to claim 1 further comprising:
   a storage unit connected between the first and second electrodes and stores electrical energy.

5. The energy converting apparatus according to claim 4, wherein the storage unit comprises a chargeable battery or a capacitor.

6. The energy converting apparatus according to claim 1, further comprising a second nanowire formed on the first electrode, the second nanowire configured to resonate in response to an electromagnetic wave at a second frequency so as to contact the second electrode, the second frequency being different than the first frequency.

7. The energy converting apparatus according to claim 6, wherein the first nanowires and the second nanowire are formed of different materials from one another.

8. The energy converting apparatus according to claim 6, wherein the first nanowire has a first length, and the second nanowire has a second length different than the first length.

9. The energy converting apparatus according to claim 6, wherein the first nanowire has a first diameter, and the second nanowire has a second diameter different than the first diameter.

10. The energy converting apparatus according to claim 1, wherein the first nanowire is formed from at least one of zinc oxide, lead zirconate titanate, and barium titanate.

11. The energy converting apparatus according to claim 1, wherein the electromagnetic wave at the first frequency is a radio frequency wave.

12. The energy converting apparatus according to claim 1, wherein the first and second electrodes are stationary electrodes.

13. A method for converting energy comprising:
    applying an electromagnetic wave at a first frequency to a first nanowire formed of a piezoelectric material to resonate the first nanowire; and
    generating electric energy through the contact between the resonating first nanowire and an electrode.

14. The method for converting energy according to claim 13, further comprising:
    applying an electromagnetic wave at a second frequency to a second nanowire formed of the piezoelectric material to resonate the second nanowire, the second frequency being different than the first frequency; and
    generating electric energy through the contact between the resonating second nanowire and the electrode.

15. The method for converting energy according to claim 13, wherein the electromagnetic wave at the first frequency is a radio frequency wave.

16. An energy converting apparatus comprising:
first and second electrodes spaced apart from each other;
first and second nanowires formed on the first electrode, the first nanowire being configured to resonate in response to an electromagnetic wave at a first frequency so as to contact the second electrode, the second nanowire being configured to resonate in response to an electromagnetic wave at a second frequency so as to contact the second electrode; and
a storage unit connected between the first and second electrodes that stores electrical energy generated by the first and second nanowires.

17. The energy converting apparatus according to claim 16, wherein the first nanowire is formed of a first material, and the second nanowire is formed of a second material that is different than the first material.

18. The energy converting apparatus according to claim 16, wherein the first nanowire has a first length, and the second nanowire has a second length different than the first length.

* * * * *